United States Patent
Tang et al.

(10) Patent No.: US 9,559,143 B2
(45) Date of Patent: Jan. 31, 2017

(54) METHOD AND SYSTEM FOR PROVIDING MAGNETIC JUNCTIONS INCLUDING FREE LAYERS THAT ARE COBALT-FREE

(71) Applicant: Samsung Electronics Co., LTD., Gyeonggi-do (KR)

(72) Inventors: Xueti Tang, Fremont, CA (US); Jang-Eun Lee, Cupertino, CA (US); Gen Feng, North Potomac, MD (US); Dustin William Erickson, Morgan Hill, CA (US)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/977,094

(22) Filed: Dec. 21, 2015

(65) Prior Publication Data

US 2016/0197119 A1 Jul. 7, 2016

Related U.S. Application Data

(60) Provisional application No. 62/099,870, filed on Jan. 5, 2015.

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 27/22* | (2006.01) |
| *H01L 43/02* | (2006.01) |

(Continued)

(52) U.S. Cl.
CPC .............. *H01L 27/222* (2013.01); *H01L 43/02* (2013.01); *H01L 43/10* (2013.01); *H01L 43/12* (2013.01)

(58) Field of Classification Search
CPC ........... H01L 21/9228; H01L 21/28079; H01L 21/038; H01L 27/222; H01L 29/1075
USPC .......... 257/68, 200, 201, 295, 296, E21.006, 257/E21.126, E21.127, E21.098, E21.155, 257/E21.645, E21, 646, E21.661, 257/E21.665; 438/106, 238, 602, 603, 438/604
See application file for complete search history.

(56) References Cited

U.S. PATENT DOCUMENTS

| | | | | |
|---|---|---|---|---|
| 7,932,571 B2* | 4/2011 | Rizzo | ...................... | G11C 11/16 257/421 |
| 8,284,594 B2* | 10/2012 | Hu | ........................ | G11C 11/16 365/158 |

(Continued)

OTHER PUBLICATIONS

Kubota, "Enhancement of perpendicular magnetic anisotropy in FeB free layers using a thin MgO cap layer," Journal of Applied Physics III, 2012.

(Continued)

*Primary Examiner* — David Nhu
(74) *Attorney, Agent, or Firm* — Convergent Law Group LLP

(57) ABSTRACT

A magnetic junction usable in a magnetic device and a method for providing the magnetic junction are described. The magnetic junction includes a free layer, a nonmagnetic spacer layer, and a reference layer. The free layer includes at least one of Fe and at least one Fe alloy. Furthermore, the free layer excludes Co. The nonmagnetic spacer layer adjoins the free layer. The nonmagnetic spacer layer residing between reference layer and the free layer. The magnetic junction is configured such that the free layer is switchable between a plurality of stable magnetic states when a write current is passed through the magnetic junction.

20 Claims, 5 Drawing Sheets

(51) Int. Cl.
   *H01L 43/10* (2006.01)
   *H01L 43/12* (2006.01)

(56) References Cited

U.S. PATENT DOCUMENTS

| | | | |
|---|---|---|---|
| 8,686,484 B2 | 4/2014 | Whig | |
| 8,871,530 B1 | 10/2014 | Hu | |
| 8,937,832 B2 * | 1/2015 | Kitagawa | H01L 43/08 365/158 |
| 9,178,133 B2 * | 11/2015 | Kitagawa | H01L 43/10 |
| 2013/0250665 A1 | 9/2013 | Kitagawa | |
| 2014/0131824 A1 | 5/2014 | Kitagawa | |

OTHER PUBLICATIONS

Masugata, Spin-torque induced rf oscillation in magnetic tunnel junctions with an FE-rich CoFeB free layer, Journal of Physics, Conf Ser. 266, 2011.

Tsunegi, "Damping parameter and interfacial perpendicular magnetic anisotropy of FeB nanopillar sandwiched between MgO barrier and cap layers in magnetic tunnel junctions," Applied Physics Express 7, 2014.

* cited by examiner

METHOD AND SYSTEM FOR PROVIDING MAGNETIC JUNCTIONS INCLUDING FREE LAYERS THAT ARE COBALT-FREE

CROSS-REFERENCE TO RELATED APPLICATIONS

This application claims the benefit of provisional Patent Application Ser. No. 62/099,870, filed Jan. 5, 2015, entitled PURE FE FREE LAYER, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a substrate 12. A bottom contact 14 and top contact 22 may be used to drive current through the conventional MTJ 10. The conventional MTJ, uses conventional seed layer(s) (not shown), may include capping layers (not shown) and may include a conventional antiferromagnetic (AFM) layer (not shown). The conventional magnetic junction 10 includes a conventional reference layer 16, a conventional tunneling barrier layer 18, and a conventional free layer 20. Also shown is top contact 22. Conventional contacts 14 and 22 are used in driving the current in a current-perpendicular-to-plane (CPP) direction, or along the z-axis as shown in FIG. 1. Typically, the conventional reference layer 16 is closest to the substrate 12 of the layers 16, 18 and 20.

The conventional reference layer 16 and the conventional free layer 20 are magnetic. For example, the conventional free layer 20 typically includes at least a CoFeB layer with the desired stoichiometry. Other magnetic and nonmagnetic layers may be part of the conventional free layer 20. The magnetization 17 of the conventional reference layer 16 is fixed, or pinned, in a particular direction. Although depicted as a simple (single) layer, the conventional reference layer 16 may include multiple layers. For example, the conventional reference layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic.

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as perpendicular-to-plane, the magnetization 21 of the conventional free layer 20 may be in plane. Thus, the reference layer 16 and free layer 20 may have their magnetizations 17 and 21, respectively oriented perpendicular to the plane of the layers.

Because of their potential for use in a variety of applications, research in magnetic memories is ongoing to improve the performance of the STT-RAM. For example, in order to achieve perpendicular magnetic moments 17 and 21, various structures have been proposed. However, such structures may suffer from higher damping (which increases the required switching current), a lower magnetoresistance that decreases the signal and/or other issues. Accordingly, what is needed is a method and system that may improve the performance of the spin transfer torque based memories. The method and system described herein address such a need.

BRIEF SUMMARY OF THE INVENTION

A magnetic junction usable in a magnetic device and a method for providing the magnetic junction are described. The magnetic junction includes a free layer, a nonmagnetic spacer layer, and a reference layer. The free layer includes at least one of Fe and at least one Fe alloy. Furthermore, the free layer excludes Co. The nonmagnetic spacer layer adjoins the free layer. The nonmagnetic spacer layer residing between reference layer and the free layer. The magnetic junction is configured such that the free layer is switchable between a plurality of stable magnetic states when a write current is passed through the magnetic junction.

DETAILED DESCRIPTION OF THE INVENTION

Figure 1:
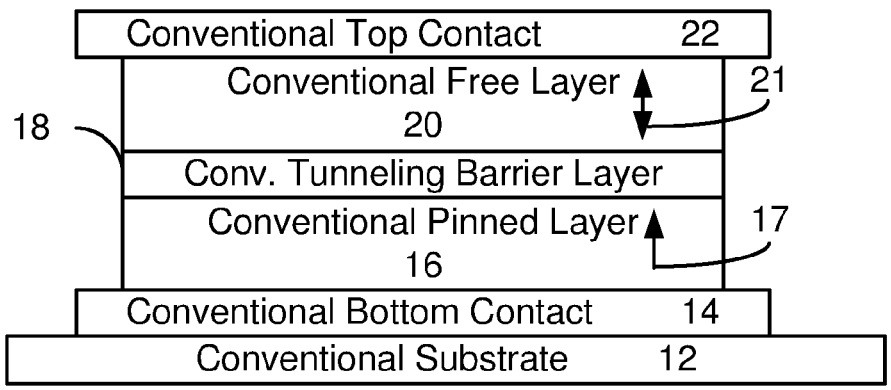
FIG. 1 depicts a conventional magnetic junction.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. The method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

A magnetic junction usable in a magnetic device and a method for providing the magnetic junction are described. The magnetic junction includes a free layer, a nonmagnetic spacer layer, and a reference layer. The free layer includes at least one of Fe and at least one Fe alloy. Furthermore, the free layer excludes Co. The nonmagnetic spacer layer adjoins the free layer. The nonmagnetic spacer layer residing between reference layer and the free layer. The magnetic junction is configured such that the free layer is switchable between a plurality of stable magnetic states when a write current is passed through the magnetic junction.

Figure 2:
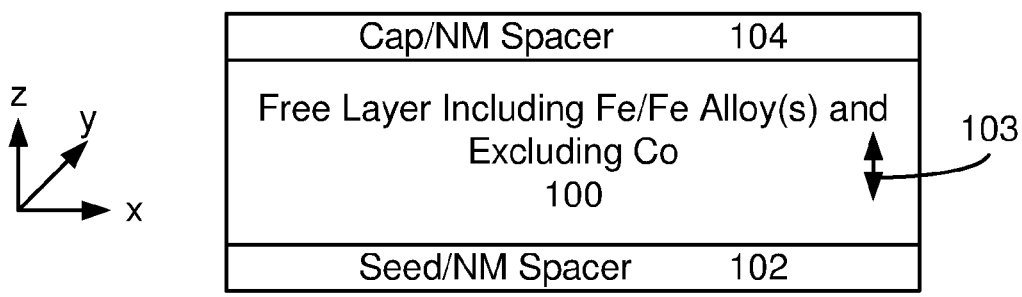
FIG. 2 depicts an exemplary embodiment of a free layer that is Co-free.

FIG. 2 depicts an exemplary embodiment of a free layer 100 that is Co-free. For clarity, FIG. 2 is not to scale. Also shown are layers 102 and 104. The layer 102 may be seed layer(s) if the free layer 100 resides at the bottom of the magnetic junction in which it is used. Stated differently, the layer 102 may be a seed layer, such as MgO, if the free layer 100 is closer to the substrate than the reference layer. In such an embodiment, the layer 104 is a nonmagnetic spacer layer for a magnetic junction. The layer 104 may, for example, be a crystalline MgO nonmagnetic spacer layer. If the free layer 100 is at the top of the magnetic junction in which it is used, then the layer 104 may be a capping layer. Stated differently, the layer 104 may be a capping layer, such as MgO, if the free layer 100 is further from the substrate than the reference layer. In such an embodiment, the layer 102 is a nonmagnetic spacer layer for the magnetic junction. For example, the layer 102 may be a crystalline MgO nonmagnetic spacer layer. If the free layer 100 is in the center of a dual magnetic junction, then the layers 102 and 104 may be nonmagnetic spacer layers. In such embodiments, the layers 102 and 104 may be MgO tunneling barrier layers.

The free layer 100 has a magnetic moment 103 and includes Fe in the form of pure Fe layer(s) and/or one or more Fe alloy layer(s). However, the free layer 100 is free of Co. Co based alloys such as CoFeB as well as pure Co layers are not present in the free layer 100. Thus, in some embodiments, the only magnetic element in the free layer 100 is Fe. Further, in some embodiments, the free layer 100 has no nonmagnetic insertion layers. In such embodiments, the free layer 100 consists of Fe layer(s) and/or Fe alloy layer(s). The free layer 100 may include only Fe layer(s) and/or $Fe_{1-x}B_x$ layer(s), where x is at least 0.2 and not more than 0.5. Further, x may vary between different alloy layers in the free layer 100. For example, the free layer 100 might include an FeB layer that is nominally twenty atomic percent B and another FeB layer that is nominally forty atomic percent B. As used herein, FeB denotes an alloy of Fe and B having a stoichiometry in the ranges described above. In some such embodiments, the free layer 100 has a thickness that is at least ten Angstroms and not more than twenty-five Angstroms. In some such embodiments, the free layer is at least twelve Angstroms and not more than eighteen Angstroms thick. In some such embodiments, the free layer 100 has a thickness of at least fifteen Angstroms and not more than twenty Angstroms. In addition, the perpendicular magnetic anisotropy energy of the free layer 100 exceeds its out-of-plane demagnetization energy. Thus, the magnetic moment of the free layer 100 may be perpendicular to plane. The free layer 100 may have a maximum thickness on the order of twenty-five Angstroms or less to ensure that the free layer magnetic moment 103 is perpendicular to plane. The magnetic junction in which the free layer 100 is also configured such that the free layer 100 is switchable between stable magnetic states when a write current is passed through the magnetic junction.

The free layer 100 may allow the magnetic junction in which it is used to have improved performance. For the free layer 100, Fe based material(s) are used. In addition, as discussed above, the free layer 100 may be without insertion layers, such as W or Ta, and without Co. As a result, the free layer 100 may have a lower damping constant. In some embodiments, the damping constant may be as low as 0.005 or less. In some such embodiments, the damping constant for the free layer 100 may be on the order of 0.002. Because of the lower damping constant, the switching current for spin transfer torque (STT) switching may be reduced. Because the free layer 100 is Fe based as discussed above, the free layer 100 may have a high saturation magnetization ($M_s$). A high $M_s$ may also aid in reducing the switching current for STT switching. In addition, the free layer 100 has a high perpendicular magnetic anisotropy. For example, the magnetic anisotropy may correspond to a magnetic field on the order of at least five hundred Oe and not more than eight thousand Oe. However, other anisotropies are possible. The perpendicular magnetic anisotropy of the free layer 100 exceeds the out-of-plane demagnetization energy. Thus, the magnetic moment of the free layer 100 may be stable perpendicular to the plane of the free layer 100. In addition, a magnetic junction using the free layer 100 and layer(s) 102 and/or 104 as tunneling barrier layer(s) may have a high tunneling magnetoresistance (TMR). Thus, performance of a magnetic junction may be improved, particularly for STT switching.

Figure 3:
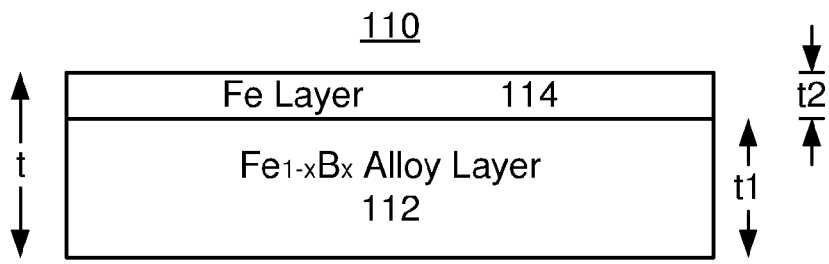
FIG. 3 depicts another exemplary embodiment of a free layer that is Co-free.

FIG. 3 depicts an exemplary embodiment of a free layer 110 that is Co-free. For clarity, FIG. 3 is not to scale. The free layer 110 may be used as the free layer 100 depicted in FIG. 2. Thus, layers analogous to layers 102 and 104 may be present but are not shown for simplicity. The free layer 110 may be viewed as a particular embodiment of the free layer 100.

The free layer 110 includes an $Fe_{1-x}B_x$ layer 112 and a pure Fe layer 114. The layer 112 adjoins, or shares an interface with, the layer 114. For the $Fe_{1-x}B_x$ layer 112, x is at least 0.2 and not more than 0.5. In some embodiments, x is nominally 0.4. In some such embodiments, the $Fe_{1-x}B_x$ layer 112 has a thickness, t1, that is at least ten Angstroms and not more than twenty-five Angstroms. In some such embodiments, the $Fe_{1-x}B_x$ layer 112 is at least twelve Angstroms and not more than eighteen Angstroms thick. In some such embodiments, the $Fe_{1-x}B_x$ layer 112 has a thickness of at least fifteen Angstroms and not more than twenty Angstroms.

The Fe layer 114 may be significantly thinner than the $Fe_{1-x}B_x$ layer 112. For example, the Fe layer 114 may have a thickness, t2, that does not exceed five Angstroms. In some embodiments, the Fe layer 114 may be not more than three Angstroms thick and greater than zero Angstroms thick. For example, the Fe layer 114 may be at least two Angstroms thick and not more than three Angstroms thick. Thus, the Fe layer 114 may be viewed as a dusting of Fe residing on the $Fe_{1-x}B_x$ layer 112. The total thickness of the free layer 110, t, is thus very similar to that of the $Fe_{1-x}B_x$ layer 114. In addition, the perpendicular magnetic anisotropy energy of the free layer 110 exceeds its out-of-plane demagnetization energy. Thus, the magnetic moment of the free layer 110 may be perpendicular to plane. In addition, the free layer 110 may have a maximum thickness on the order of twenty-five Angstroms or less to ensure that the free layer magnetic moment is perpendicular to plane. The magnetic junction in which the free layer 110 is also configured such that the free layer 110 is switchable between stable magnetic states when a write current is passed through the magnetic junction. Thus, the free layer 110 consists of $Fe_{1-x}B_x$ layer 112 and Fe layer 114. No nonmagnetic insertion layers, no Co layers and no Co based alloys are used.

The free layer 110 may improve the performance of the magnetic junction in which it is used. For the free layer 110, a pure Fe layer 114 and a CoFeB layer 112 are used. The free layer 110 is without insertion layers, such as W or Ta, and without Co. As a result, the free layer 110 may have a lower damping constant and the switching current for STT switching. The free layer 110 may also have a high $M_s$, again reducing the switching current for STT switching. In addition, the free layer 110 has a high perpendicular magnetic anisotropy, particularly if MgO layers adjoin the free layer 110. Further, the magnetic junction using the free layer 110 may have a high TMR. Thus, performance of a magnetic junction may be improved, particularly for STT switching.

Figure 4:
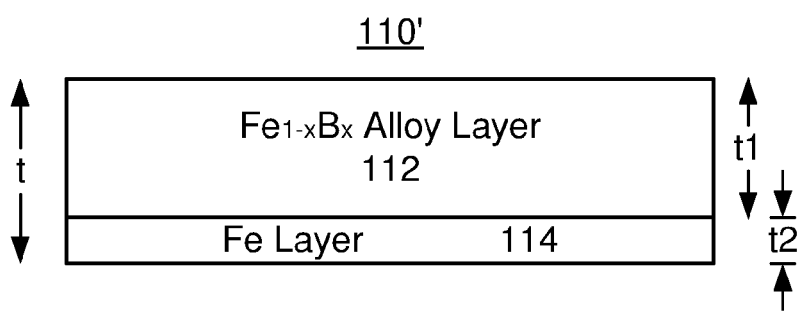
FIG. 4 depicts another exemplary embodiment of a free layer that is Co-free.

FIG. 4 depicts an exemplary embodiment of a free layer 110' that is Co-free. For clarity, FIG. 4 is not to scale. The free layer 110' may be used as the free layer 100 depicted in FIG. 2. Thus, layers analogous to layers 102 and 104 may be present but are not shown for simplicity. The free layer 110' may be viewed as a particular embodiment of the free layer 100. The free layer 110' is also analogous to the free layer 110. The free layer 110' thus includes layers 112 and 114 having thicknesses t1 and t2, respectively, that are analogous to those of the free layer 110 and layers 112 and 114, respectively. However, the Fe layer 114 is closer to the substrate than the FeB layer 112 in the embodiment shown in FIG. 4.

Thus, the free layer 110' consists of $Fe_{1-x}B_x$ layer 112 and Fe layer 114. The layer 112 adjoins, or shares an interface with, the layer 114. The free layer 110' thus shares the benefits of the free layer(s) 100 and/or 110. A magnetic junction using the free layer 110' may thus have a high perpendicular anisotropy, low damping and high TMR.

Figure 5:
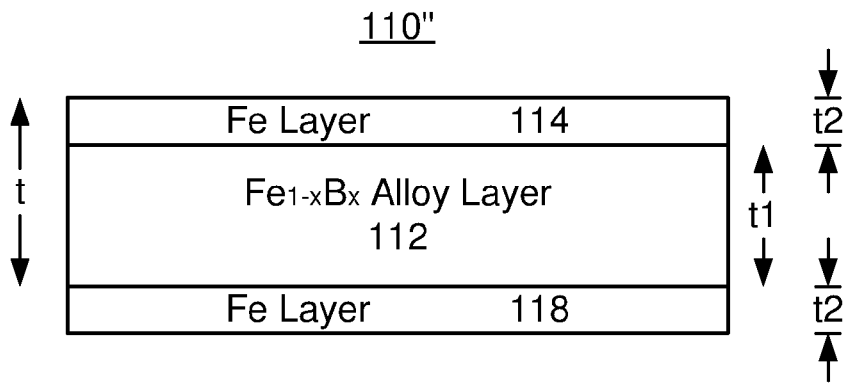
FIG. 5 depicts another exemplary embodiment of a free layer that is Co-free.

FIG. 5 depicts an exemplary embodiment of a free layer 110" that is Co-free. For clarity, FIG. 5 is not to scale. The free layer 110' may be used as the free layer 100 depicted in FIG. 2. Thus, layers analogous to layers 102 and 104 may be present but are not shown for simplicity. In addition, the free layer 110" may be viewed as a particular embodiment of the free layer 100. The free layer 110" is also analogous to the free layers 110 and 110'. The free layer 110" thus includes layers 112 and 114 having thicknesses t1 and t2, respectively, that are analogous to those of the free layer 110 and layers 112 and 114, respectively.

In addition, the free layer 110''' includes Fe layer 118. The Fe layer 118 is analogous to the Fe layer 114 and may thus have a thickness in the same range. The thickness of the Fe layer 118 can, but need not, be the same as that of the Fe layer 114. The layers 112 and 114 and the layers 112 and 118 adjoin, sharing interfaces. Thus, the free layer 110" consists of $Fe_{1-x}B_x$ layer 112 sharing interfaces with and sandwiched by Fe layer 114 and Fe layer 118.

The free layer 110" shares the benefits of the free layer(s) 100, 110 and/or 110'. The free layer 110' may thus have a high perpendicular anisotropy, low damping resulting in a lower spin transfer switching current and high TMR when used in a magnetic junction.

Figure 6:
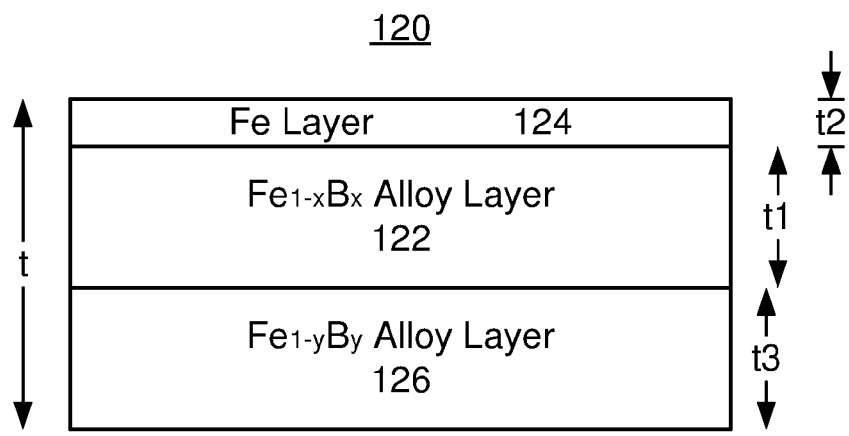
FIG. 6 depicts another exemplary embodiment of a free layer that is Co-free.

FIG. 6 depicts an exemplary embodiment of a free layer 120 that is Co-free. For clarity, FIG. 6 is not to scale. The free layer 120 may be used as the free layer 100 depicted in FIG. 2. Thus, layers analogous to layers 102 and 104 may be present but are not shown for simplicity. The free layer 120 may be viewed as a particular embodiment of the free layer 100. The free layer 120 is also analogous to the free layer 110, 110' and 110". Thus, analogous components have similar labels The free layer 120 includes an $Fe_{1-x}B_x$ layer 122 and a pure Fe layer 124 that are analogous to the layers 112 and 114, respectively, described above. The $Fe_{1-x}B_x$ layer 122 adjoins, or shares an interface with, the Fe layer 124. For the $Fe_{1-x}B_x$ layer 122, x is at least 0.2 and not more than 0.5. In some embodiments, x is nominally 0.4. In some such embodiments, the $Fe_{1-x}B_x$ layer 122 has a thickness, t1, that is at least ten Angstroms and not more than twenty-five Angstroms. In some such embodiments, the $Fe_{1-x}B_x$ layer 122 is at least twelve Angstroms and not more than eighteen Angstroms thick. In some such embodiments, the $Fe_{1-x}B_x$ layer 122 has a thickness of at least fifteen Angstroms and not more than twenty Angstroms.

The Fe layer 124 may be significantly thinner than the $Fe_{1-x}B_x$ layer 122. For example, the Fe layer 124 may have a thickness, t2, that does not exceed five Angstroms. In some embodiments, the Fe layer 124 may be not more than three Angstroms thick and greater than zero Angstroms thick. For example, the Fe layer 124 may be at least two Angstroms thick and not more than three Angstroms thick. Thus, the Fe layer 124 may be viewed as a dusting of Fe residing on the $Fe_{1-x}B_x$ layer 122.

The free layer 120 also includes an $Fe_{1-y}B_y$ layer 126 that is analogous to the layers 112 and 122, described above. The $Fe_{1-y}B_y$ layer 126 adjoins, or shares an interface with, the Fe layer 124 and $Fe_{1-x}B_x$ layer 122. The thickness and stoichiometry ranges for the $Fe_{1-x}B_y$ layer 126 are analogous to those of the $Fe_{1-x}B_x$ layer 122. Although it is possible, the stoichiometries may but need not match for the layers 122 and 126. For example, the $Fe_{1-y}B_y$ layer 126 may be nominally forty percent Co, while the $Fe_{1-x}B_x$ layer 122 may be nominally twenty atomic percent B. In some embodiments, the higher Fe concentration layer may be closer to the substrate. However, FeB layers 122 and 126 with different stoichiometries within the range described above may be present in other embodiments. Similarly, the thickness, t3, of the $Fe_{1-y}B_y$ layer 126 may, but need not be, equal to the thickness of the $Fe_{1-x}B_x$ layer 122.

The perpendicular magnetic anisotropy energy of the free layer 120 exceeds its out-of-plane demagnetization energy. Thus, the magnetic moment of the free layer 120 may be perpendicular to plane. The free layer 120 may have a maximum thickness on the order of twenty-five Angstroms or less to ensure that the free layer magnetic moment is perpendicular to plane. The magnetic junction in which the free layer 120 is also configured such that the free layer 120 is switchable between stable magnetic states when a write current is passed through the magnetic junction. Thus, the free layer 120 consists of $Fe_{1-x}B_x$ layer 122 and Fe layer 124 and $Fe_{1-y}B_y$ layer 126. No nonmagnetic insertion layers, no Co layers and no Co based alloys are used.

The free layer 120 may allow the magnetic junction in which it is used to have improved performance. For the free layer 120, a pure Fe layer 123 and CoFeB layers 122 and 126 are used. The free layer 120 is without insertion layers, such as W or Ta, and without Co. As a result, the free layer 120 may have a lower damping constant and the switching current for STT switching. The free layer 120 may also have a high $M_s$, again reducing the switching current for STT switching. In addition, the free layer 120 has a high perpendicular magnetic anisotropy, particularly if MgO layers adjoin the free layer 120. Further, the magnetic junction using the free layer 120 may have a high TMR. Thus, performance of a magnetic junction may be improved, particularly for STT switching.

Figure 7:
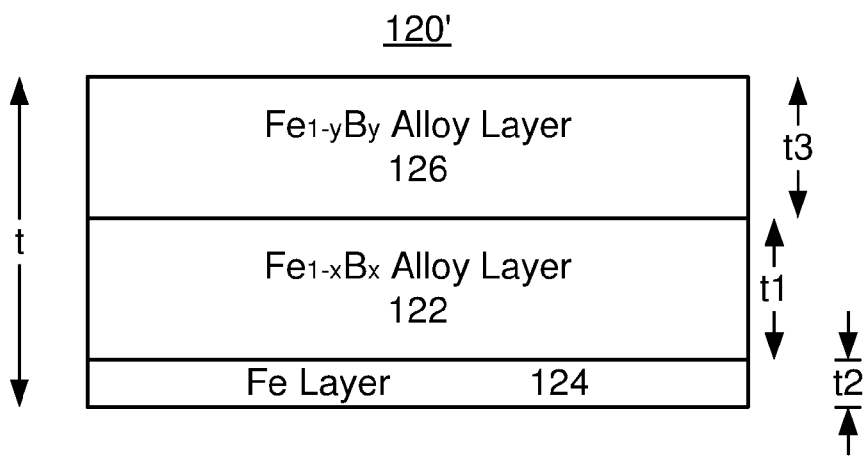
FIG. 7 depicts another exemplary embodiment of a free layer that is Co-free.

FIG. 7 depicts an exemplary embodiment of a free layer 120' that is Co-free. For clarity, FIG. 4 is not to scale. The free layer 120' may be used as the free layer 100 depicted in FIG. 2. Thus, layers analogous to layers 102 and 104 may be present but are not shown for simplicity. In addition, the free layer 120' may be viewed as a particular embodiment of the free layer 100. The free layer 120' is also analogous to the free layer 120. The free layer 120' thus includes layers 122, 124 and 126 having thicknesses t1, t2 and t3, respectively, that are analogous to those of the free layer 120 and layers 122, 124 and 126, respectively. However, the Fe layer 124 is closer to the substrate than the FeB layers 122 and 126 in the embodiment shown in FIG. 7.

Thus, the free layer 120' consists of $Fe_{1-x}B_x$ layer 122, $Fe_{1-y}B_y$ layer 126 and Fe layer 124. The layer 122 adjoins, or shares an interface with, the layer 124. Similarly, the layer FeB 122 adjoins the FeB layer 126. The free layer 120' thus shares the benefits of the free layer(s) 100, 110, 110', 110" and/or 120. A magnetic junction including the free layer 120' may thus have a high perpendicular anisotropy, low damping, low switching current and high TMR.

Figure 8:
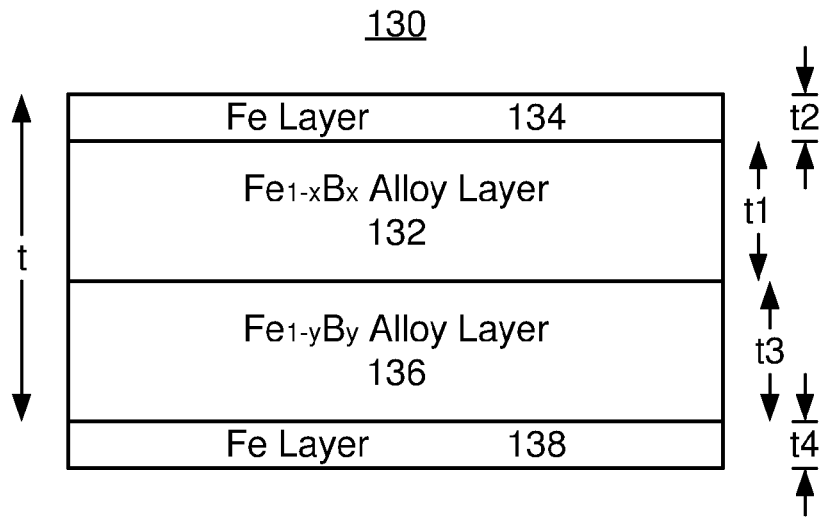
FIG. 8 depicts another exemplary embodiment of a free layer that is Co-free.

FIG. 8 depicts an exemplary embodiment of a free layer 120" that is Co-free. For clarity, FIG. 8 is not to scale. The free layer 120" may be used as the free layer 100 depicted in FIG. 2. Thus, layers analogous to layers 102 and 104 may be present but are not shown for simplicity. In addition, the free layer 120" may be viewed as a particular embodiment of the free layer 100. The free layer 120" is also analogous to the free layers 120 and 120'. The free layer 120" thus includes layers 122, 124 and 126 having thicknesses t1, t2 and t3, respectively, that are analogous to those of the free layer 120 and layers 122, 124 and 126, respectively.

In addition, the free layer 120" includes Fe layer 128. The Fe layer 128 is analogous to the Fe layer 124 and may thus have a thickness, t4, in the same range. The thickness of the Fe layer 128 can, but need not, be the same as that of the Fe layer 124. The layers 122 and 124, the layers 122 and 126 and the layers 126 and 128 adjoin, sharing interfaces. Thus, the free layer 120" consists of $Fe_{1-x}B_x$ layer 122, $Fe_{1-y}B_y$ layer 126 and Fe layers 124 and 128.

The free layer 120" shares the benefits of the free layer(s) 100, 120 and/or 120'. The free layer 120' may thus have a high perpendicular anisotropy, low damping resulting in a lower spin transfer switching current and high TMR when used in a magnetic junction.

Figure 9:
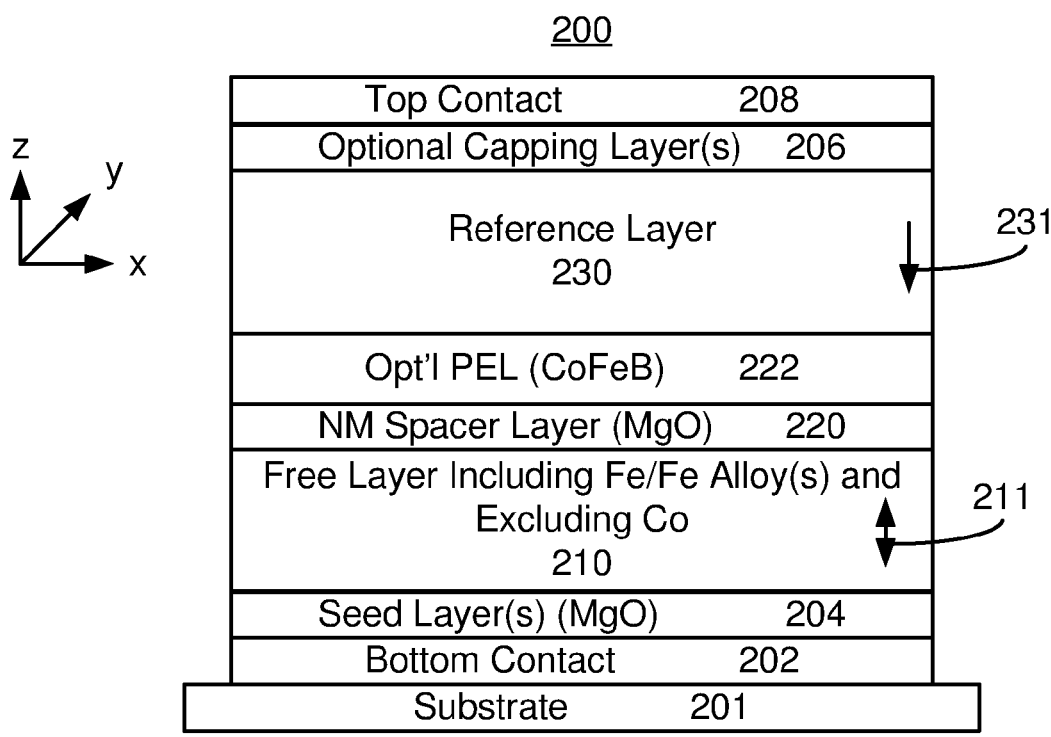
FIG. 9 depicts an exemplary embodiment of a magnetic junction including a free layer that is Co-free, usable in a magnetic memory programmable using spin transfer torque.

FIG. 9 depicts an exemplary embodiment of a magnetic junction 200 and which is usable in a magnetic memory programmable utilizing spin transfer and which includes a free layer 100, 110, 110', 110", 120, 120' and/or 120". For clarity, FIG. 9 is not to scale. The magnetic junction 200 may be used in a magnetic device such as a STT-RAM and, therefore, in a variety of electronic devices. The magnetic junction 200 includes a free layer 210 having magnetic moment 211, a nonmagnetic spacer layer 220, and a reference layer 230 having magnetic moment 231. Also shown is an underlying substrate 201 in which devices including but not limited to a transistor may be formed. Bottom contact 202, top contact 208, optional seed layer(s) 204 and optional capping layer(s) 206 are also shown.

As can be seen in FIG. 9, the reference layer 230 is closer to the top (furthest from a substrate 201) of the magnetic junction 200. However, in other embodiments, the reference layer 230 may be closer to the substrate 201 than the free layer 210. An optional pinning layer (not shown) may be used to fix the magnetization (not shown) of the reference layer 230. In some embodiments, the optional pinning layer may be an AFM layer or multilayer that pins the magnetization (not shown) of the reference layer 230 by an exchange-bias interaction. However, in other embodiments, the optional pinning layer may be omitted or another structure may be used.

The magnetic junction 200 is also configured to allow the free layer 210 to be switched between stable magnetic states when a write current is passed through the magnetic junction 200. Thus, the free layer 210 is switchable utilizing spin transfer torque. In some embodiments, the switching is accomplished using only STT. However, in other embodiments, other mechanisms including but not limited to spin orbit torque and/or an applied field may also contribute to the switching.

In addition to contacts 202 and 206 and substrate 201, seed layer(s) 204 and capping layer(s) 206 are shown. The free layer 210 is closer to the substrate 201 than the reference layer 230 and grown on the seed layer 204. Thus, the seed layer 204 may be crystalline MgO in order to improve the perpendicular anisotropy of the free layer 210. Thus, the seed layer 204 may be analogous to the layer 102 described above.

The nonmagnetic spacer layer 220 may be an MgO tunneling barrier layer. The MgO layer may have a 200 orientation for enhanced tunneling magnetoresistance (TMR). However, in other embodiments, the nonmagnetic spacer layer 220 may be a conductor, such as Cu, or another insulating tunneling barrier layer. Other configurations, such as conductive channels in an insulating matrix, are also possible.

The reference layer 230 and the free layer 210 are magnetic. In the embodiment shown, the perpendicular magnetic anisotropy of the free layer 210 exceeds its out-of-plane demagnetization energy. Similarly, the perpendicular magnetic anisotropy of the reference layer 230 exceeds its out-of-plane demagnetization energy. Thus, the easy axis 211 of the free layer 210 and the magnetic moment 231 of the reference layer 230 are shown as perpendicular-to-plane (in the z-direction). In other embodiments, one or both of the layers 210 and 230 might be in-plane.

The reference layer 230 may be a multilayer. For example, the reference layer 230 may be a SAF including multiple ferromagnetic layers interleaved with nonmagnetic layer(s). In such embodiments, the magnetic moments of the ferromagnetic layers maybe coupled antiparallel. Each ferromagnetic layer may also include sublayers including but not limited to multiple ferromagnetic layers. In other embodiments, the reference layer 230 may be another multilayer. Further, a polarization enhancement layer (PEL) 222 having a high spin polarization and/or other layer(s) is provided between the reference layer 230 and the nonmagnetic spacer layer 220. In some embodiments, a PEL (not shown) may be between the free layer 210 and the nonmagnetic spacer layer 220. For example, the PEL 222 may include a CoFeB layer. However, in the embodiment shown, the free layer 210 shares an interface with the nonmagnetic spacer layer 220.

The free layer 210 is a free layer 100, 110, 110', 110", 120, 120' and/or 120". Thus, the free layer 210 may consist of Fe layer(s) and Fe alloy layer(s). Nonmagnetic insertion layers and Co-containing layers may be omitted. As a result, the magnetic junction 200 may enjoy the benefits of free layer(s) 100, 110, 110', 110", 120, 120' and/or 120'". The magnetic junction 200 including the free layer 210 may have a high perpendicular anisotropy, low damping resulting in a lower spin transfer switching current and high TMR. Thus, a magnetic junction 200 having the desired magnetic orientation, signal and moderate switching current for STT switching may be achieved.

Figure 10:
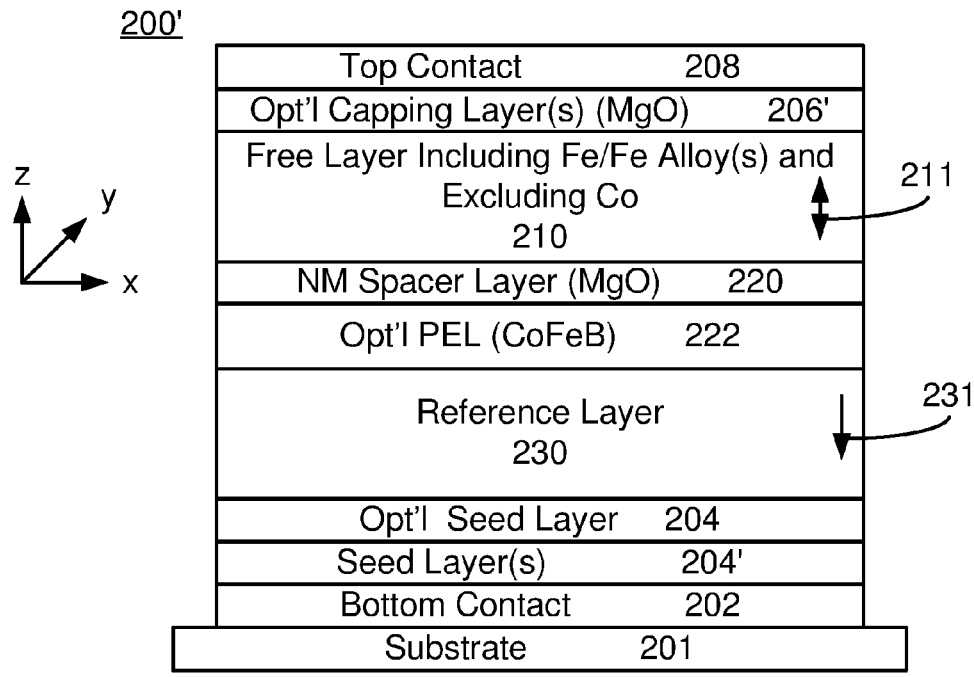
FIG. 10 depicts another exemplary embodiment of a magnetic junction including a free layer that is Co-free, usable in a magnetic memory programmable using spin transfer torque.

FIG. 10 depicts an exemplary embodiment of a magnetic junction 200' which is usable in a magnetic memory programmable utilizing spin transfer and that uses the free layer 100, 110, 110', 110", 120, 120' and/or 120". For clarity, FIG. 10 is not to scale. The magnetic junction 200' may be used in a magnetic device such as a STT-RAM and, therefore, in a variety of electronic devices. The magnetic junction 200' is analogous to the magnetic junction 200. As a result, similar components have similar labels. The magnetic junction 200' includes a free layer 210 having magnetic moment 211, a nonmagnetic spacer layer 220, and a reference layer 230 having magnetic moment 231 that are analogous to the free layer 210 having magnetic moment 211, the nonmagnetic spacer layer 220, and the reference layer 230 having magnetic moment 231, respectively, depicted in FIG. 9. Also shown are an underlying substrate 201, bottom contact 202, top contact 208, optional seed layer(s) 204, optional capping layer(s) 206 and optional PEL 222 that are analogous to the substrate 201, bottom contact 202, top contact 208, optional seed layer(s) 204, optional capping layer 206 and optional PEL 222 shown in FIG. 9.

The magnetic junction 200' is also configured to allow the free layer 210 to be switched between stable magnetic states when a write current is passed through the magnetic junction 200'. Thus, the free layer 210 is switchable utilizing spin transfer torque. In some embodiments, the switching is accomplished using only STT. However, in other embodiments, other mechanisms including but not limited to spin orbit torque and/or an applied field may also contribute to the switching.

As can be seen in FIG. 10, the reference layer 230 is now closer to the substrate 201 than the free layer 210. The nonmagnetic spacer layer 220 is thus provided on the reference layer 210. The reference layer 230 and the free layer 210 are magnetic and analogous to those in the magnetic junction 200. In the embodiment shown, the perpendicular magnetic anisotropy of the reference layer 230 exceeds its out-of-plane demagnetization energy. Similarly, the perpendicular magnetic anisotropy of the free layer 210 exceeds its out-of-plane demagnetization energy. Thus, the easy axis 211 of the free layer 210 and the magnetic moment 231 of the reference layer 230 are shown as perpendicular-to-plane (in the z-direction). In other embodiments, one or both of the layers 210 and 230 might be in-plane. The free layer 210 is the free layer 100, 110, 110', 110", 120, 120' and/or 120". In the embodiment shown, the capping layer 206' may be an MgO capping layer analogous to the layer 104 depicted in FIG. 2. Such an MgO capping layer may improve the performance of the free layer 210, for example, by enhancing the perpendicular magnetic anisotropy of the free layer 210.

The magnetic junction 200' may enjoy the benefits of the free layers 100, 110, 110', 110", 120, 120' and/or 120" as well as the magnetic junction 200. Thus, a magnetic junction 200' having the desired magnetic orientation, PMA configuration, magnetoresistance and moderate switching current for STT switching may be achieved.

Figure 11:
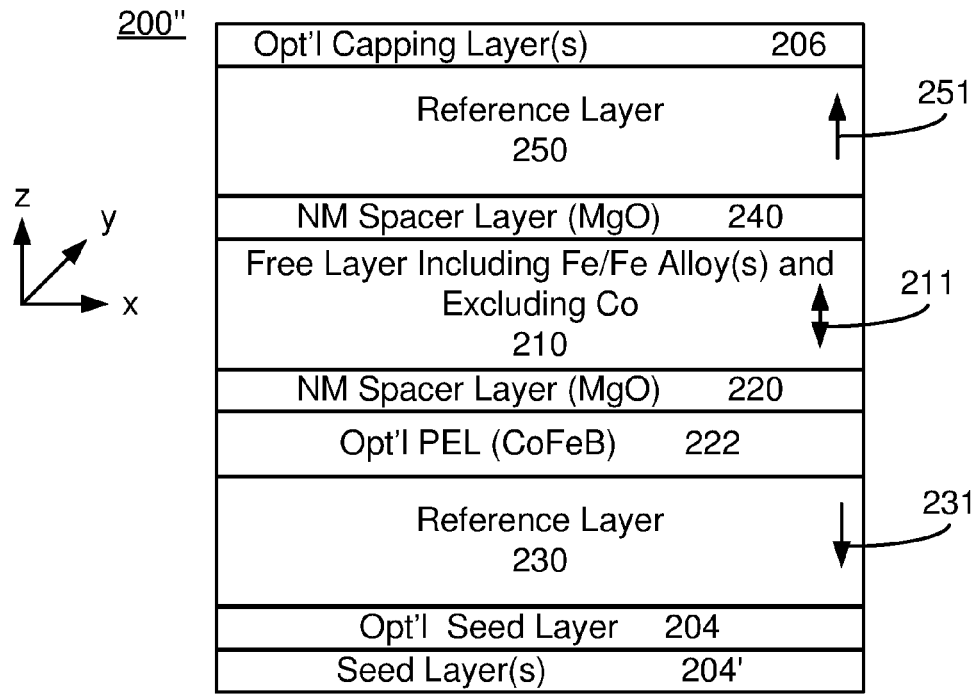
FIG. 11 depicts another exemplary embodiment of a magnetic junction including a free layer that is Co-free, usable in a magnetic memory programmable using spin transfer torque.

FIG. 11 depicts an exemplary embodiment of a magnetic junction 200" which is usable in a magnetic memory programmable utilizing spin transfer and which includes the free layer 100, 110, 110', 110", 120, 120' and/or 120". For clarity, FIG. 11 is not to scale. For simplicity, the substrate is also not shown. The magnetic junction 200" may be used in a magnetic device such as a STT-RAM and, therefore, in a variety of electronic devices. The magnetic junction 200" is analogous to the magnetic junction 200 and/or 200'. As a result, similar components have similar labels. The magnetic junction 200" includes a free layer 210 having magnetic moment 211, a nonmagnetic spacer layer 220, and a reference layer 230' that are analogous to the free layer 210 having magnetic moment 211, the nonmagnetic spacer layer 220, and the reference layer 230 having magnetic moment 231, respectively, depicted in FIGS. 9-10. Also shown are an underlying substrate 201, bottom contact 202, top contact 208, optional seed layer(s) 204, optional capping layer(s) 206 and optional PEL 222 that are analogous to the substrate 201, bottom contact 202, top contact 208, optional seed layer(s) 204, optional capping layer 206 and PEL shown in FIGS. 9-10.

The magnetic junction 200" is also configured to allow the free layer 210 to be switched between stable magnetic states when a write current is passed through the magnetic junction 200". Thus, the free layer 210 is switchable utilizing spin transfer torque. In some embodiments, the switching is accomplished using only STT. However, in other embodiments, other mechanisms including but not limited to spin orbit torque and/or an applied field may also contribute to the switching.

As can be seen in FIG. 11, magnetic junction 200''' is a dual magnetic junction. Thus, the magnetic junction 200''' also includes an additional nonmagnetic spacer layer 240 and an additional reference layer 250 that are analogous to the layers 220 and 230/230', respectively. In the embodiment shown, the magnetic moments 231 and 251 of the reference layers 230 and 250 are aligned antiparallel (in a dual state). However, in other embodiments or another configuration, the magnetic moments 231 and 251 may be in the anti-dual state (parallel). The nonmagnetic spacer layer 240 may be a conductor, an insulating tunneling barrier layer such as crystalline MgO or may have another structure. In some embodiments, the spacer layers 220 and 240 are crystalline MgO. Such spacer layers 220 and 240 may allow not only for increased TMR but also enhanced perpendicular magnetic anisotropy of the free layer 210. The perpendicular magnetic anisotropy of the reference layers 230 and 250 exceed their out-of-plane demagnetization energy. Thus, the magnetic moments of the reference layers 230 and 250 are perpendicular-to-plane. In other embodiments, the magnetic moment of the reference layer 230 and/or 250 might be in-plane. The reference layer 250 may also be a SAF. Although not shown, an optional PEL might be included between the spacer layer 240 and the reference layer 250.

The free layer 210 is the free layer 100, 110, 110', 110", 120, 120' and/or 120". The magnetic junction 200" may enjoy the benefits of the free layers 100, 110, 110', 110", 120, 120' and/or 120" as well as the magnetic junction 200. Thus, a magnetic junction 200" having the desired magnetic orientation, PMA configuration, magnetoresistance and moderate switching current for STT switching may be achieved.

Various configurations of the free layer 100, 110, 110', 110", 120, 120' and/or 120" as well as the magnetic junction(s) 200, 200' and/or 200" are highlighted. One of ordinary skill in the art will recognize that various features of the free layers 100, 110, 110', 110", 120, 120' and/or 120" and particular features of the magnetic junction(s) 200, 200' and/or 200" may be combined. For example, the free layer 210 might include multiple repeats of the bilayer 112/114 depicted in FIGS. 3-4 and/or multiple repeats of the trilayer 122/124/126 depicted in FIGS. 6-7. However, in such embodiments, the thicknesses of the layers 112, 114, 122, 124 and/or 126 may be adjusted such that the total thickness of the free layer 210 remains sufficiently small for the perpendicular magnetic anisotropy of the free layer to remain high.

Figure 12:
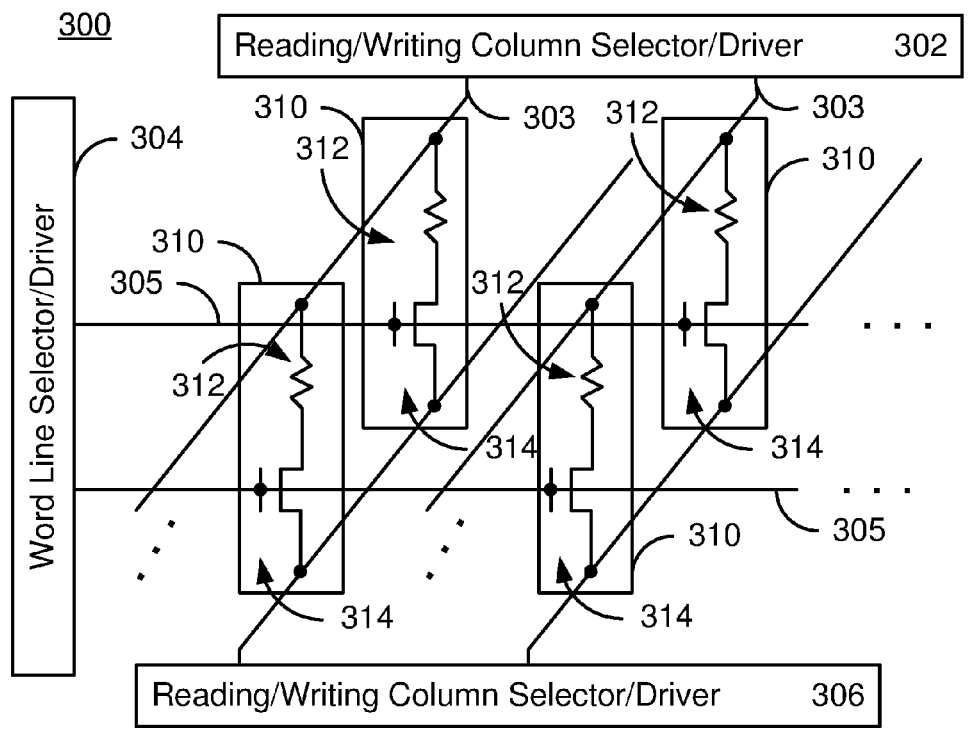
FIG. 12 depicts an exemplary embodiment of a memory utilizing magnetic junctions including Co-free free layers in the memory element(s) of the storage cell(s).
Figure 13:
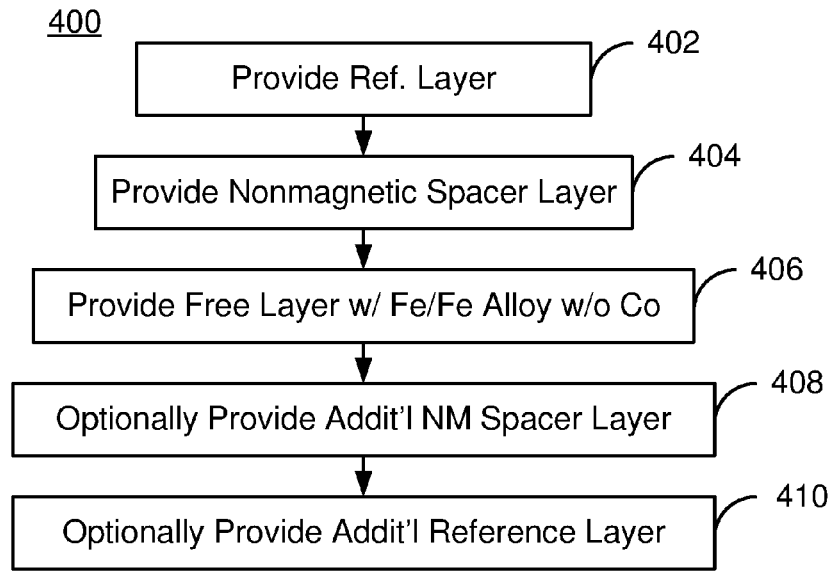
FIG. 13 is a flow chart depicting an exemplary embodiment of a method for providing a magnetic junction including at least one Heusler multilayer usable in a magnetic memory programmable using spin transfer torque.

FIG. 12 depicts an exemplary embodiment of a memory 300 that may use one or more of the magnetic junctions 200, 200' and/or 200" as well as the free layer(s) 100, 110, 110', 110", 120, 120' and/or 120". The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the magnetic junctions 200, 200' and/or 200" disclosed herein. Although one magnetic junction 312 is shown per cell 310, in other embodiments, another number of magnetic junctions 312 may be provided per cell. As such, the magnetic memory 300 may enjoy the benefits described above.

FIG. 15 depicts an exemplary embodiment of a method 400 for fabricating a magnetic junction including free layers that are Co-free and usable in a magnetic device such as a spin transfer torque random access memory (STT-RAM) and, therefore, in a variety of electronic devices. For simplicity, some steps may be omitted, performed in another or combined. Further, the method 400 may start after other steps in forming a magnetic memory have been performed. For simplicity, the method 400 is described in the context of the magnetic junctions 200, 200' and 200". However, other magnetic junctions may be formed.

A reference layer 230/230'/330 is provided on the substrate, via step 402. In some embodiments, step 402 includes depositing the material(s) for the reference layer 230. Step 402 may also include providing a multilayer including but not limited to a SAF. The edges of the reference layer 230 may be defined at a later time, for example after deposition of the remaining layers of the magnetic junction.

A nonmagnetic spacer layer 220 is provided, via step 404. Step 404 may include depositing MgO, which forms a tunneling barrier layer. In some embodiments, step 404 may include depositing MgO using, for example, radio frequency (RF) sputtering. In other embodiments, metallic Mg may be deposited, then oxidized in step 404. As discussed above with respect to step 402, the edges of the nonmagnetic spacer layer 220 may be defined at a later time, for example after deposition of the remaining layers of the magnetic junction. In addition, the anneal step discussed above may be performed after deposition of the nonmagnetic spacer layer 220 in step 404.

A free layer 210 is provided, via step 406. In some embodiments, step 406 includes providing the free layer 100, 110, 110', 110", 120, 120' and/or 120". Thus, the nonmagnetic spacer layer 220 is between the reference layer 230 and the free layer 210. As discussed above with respect to step 402, the edges of the reference layer may be defined at a later time, for example after deposition of the remaining layers of the magnetic junction.

If a dual magnetic junction 200" is to be provided, the additional nonmagnetic spacer layer 240 is provided, via step 408. Step 408 is analogous to step 404. In addition, annealing, or otherwise providing adequate energy for crystallization, may be performed for an MgO spacer layer 240.

If the dual magnetic junction 200"" is being fabricated, then the reference layer 250 is provided, via step 410. Step 410 may include providing a multilayer including but not limited to a SAF. Fabrication of the magnetic junction may be completed. For example, capping layers may be deposited and the edges of the magnetic junction defined.

Using the method 400, the magnetic junction 200, 200' and/or 200" may be formed. Thus, the benefits of the magnetic junction(s) 200, 200' and/or 200" and the free layer(s) 100, 110, 110', 110", 120, 120' and/or 120" may be achieved.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction residing on a substrate and usable in a magnetic device comprising:
   a free layer including at least one of Fe and at least one Fe alloy, the free layer excluding Co;
   a nonmagnetic spacer layer adjoining the free layer; and
   a reference layer, the nonmagnetic spacer layer residing between reference layer and the free layer;
   wherein the magnetic junction is configured such that the free layer is switchable between a plurality of stable magnetic states when a write current is passed through the magnetic junction; and
   wherein at least one of the free layer includes at least one material selected from Fe metal and $Fe_{1-x}B_x$, the free layer includes an Fe layer and an $Fe_{1-x}B_x$ layer, the magnetic junction further includes an MgO seed layer adjoining the free layer, the magnetic junction further includes an MgO capping layer adjoining the free layer, and the magnetic junction further includes an additional nonmagnetic spacer layer and an additional pinned layer, the free layer being between the nonmagnetic spacer layer and the additional nonmagnetic spacer layer, the additional nonmagnetic spacer layer being between the free layer and the additional pinned layer.

2. A magnetic junction residing on a substrate and usable in a magnetic device comprising:
   a free layer including at least one of Fe and at least one Fe alloy, the free layer excluding Co, wherein the free layer consists only of at least one Fe layer and at least one magnetic Fe alloy layer;
   a nonmagnetic spacer layer adjoining the free layer; and
   a reference layer, the nonmagnetic spacer layer residing between reference layer and the free layer;
   wherein the magnetic junction is configured such that the free layer is switchable between a plurality of stable magnetic states when a write current is passed through the magnetic junction.

3. The magnetic junction of claim 1 wherein the free layer includes the at least one material selected from Fe metal and $Fe_{1-x}B_x$.

4. The magnetic junction of claim 1 wherein the free layer includes the Fe layer and the $Fe_{1-x}B_x$ layer.

5. The magnetic junction of claim 4 wherein the free layer further includes:
   an additional Fe layer, the $Fe_{1-x}B_x$ layer being between the Fe layer and the additional Fe layer.

6. The magnetic junction of claim 4 wherein the free layer further includes an $Fe_{1-y}B_y$ layer, the $Fe_{1-x}B_x$ layer being between the Fe layer and the $Fe_{1-y}B_y$ layer.

7. The magnetic junction of claim 5 wherein x is greater than y.

8. The magnetic junction of claim 6 wherein the free layer further includes:
   an additional Fe layer, the $Fe_{1-x}B_x$ layer and the $Fe_{1-y}B_y$ layer being between the Fe layer and the additional Fe layer.

9. The magnetic junction of claim 1 further comprising:
   the MgO seed layer adjoining the free layer.

10. The magnetic junction of claim 1 further comprising:
    the MgO capping layer adjoining the free layer.

11. The magnetic junction of claim 1 further comprising:
    the additional nonmagnetic spacer layer, the free layer being between the nonmagnetic spacer layer and the additional nonmagnetic spacer layer; and
    the additional pinned layer, the additional nonmagnetic spacer layer being between the free layer and the additional pinned layer.

12. A magnetic memory residing on a substrate, the magnetic memory comprising:
    a plurality of magnetic storage cells, each of the plurality of magnetic storage cells including at least one magnetic junction, the at least one magnetic junction including a free layer, a nonmagnetic spacer layer and a reference layer, the nonmagnetic spacer layer adjoining the free layer and residing between reference layer and the free layer, the free layer including at least one of Fe and at least one Fe alloy, the free layer excluding Co, the at least one magnetic junction being configured such that the free layer is switchable between a plurality of stable magnetic states when a write current is passed through the magnetic junction; and
    a plurality of bit lines coupled with the plurality of magnetic storage cells; and
    wherein at least one of the free layer includes at least one material selected from Fe metal and $Fe_{1-x}B_x$, the free layer includes an Fe layer and an $Fe_{1-x}B_x$ layer, the free layer consists only of at least one Fe layer and at least one magnetic Fe alloy layer, the magnetic junction further includes an MgO seed layer adjoining the free layer, the magnetic junction further includes an MgO capping layer adjoining the free layer, and the magnetic junction further includes an additional nonmagnetic spacer layer and an additional pinned layer, the free layer being between the nonmagnetic spacer layer and the additional nonmagnetic spacer layer, the additional nonmagnetic spacer layer being between the free layer and the additional pinned layer.

13. The magnetic memory of claim 12 wherein the free layer consists only of the at least one Fe layer and the at least one magnetic Fe alloy layer.

14. The magnetic memory of claim 12 wherein the free layer includes the Fe layer and the $Fe_{1-x}B_x$ layer.

15. The magnetic memory of claim 14 wherein the free layer further includes:
    an additional Fe layer, the $Fe_{1-x}B_x$ layer being between the Fe layer and the additional Fe layer.

16. The magnetic memory of claim 15 wherein the free layer further includes an $Fe_{1-y}B_y$ layer, the $Fe_{1-x}B_x$ layer being between the Fe layer and the $Fe_{1-y}B_y$ layer.

17. The magnetic memory of claim 16 wherein the free layer further includes:
an additional Fe layer, the $Fe_{1-x}B_x$ layer and the $Fe_{1-y}B_y$ layer being between the Fe layer and the additional Fe layer.

18. The magnetic memory of claim 12 further comprising:
the additional nonmagnetic spacer layer, the free layer being between the nonmagnetic spacer layer and the additional nonmagnetic spacer layer; and
the additional pinned layer, the additional nonmagnetic spacer layer being between the free layer and the additional pinned layer.

19. A method for providing a magnetic junction residing on a substrate and usable in a magnetic device, the method comprising:
providing a free layer including at least one of Fe and at least one Fe alloy, the free layer excluding Co;
providing a nonmagnetic spacer layer adjoining the free layer; and
providing a reference layer, the nonmagnetic spacer layer residing between reference layer and the free layer;
wherein the magnetic junction is configured such that the free layer is switchable between a plurality of stable magnetic states when a write current is passed through the magnetic junction; and
wherein at least one of the free layer includes at least one material selected from Fe metal and $Fe_{1-x}B_x$, the free layer includes an Fe layer and an $Fe_{1-x}B_x$ layer, the free layer consists only of at least one Fe layer and at least one magnetic Fe alloy layer, the magnetic junction further includes an MgO seed layer adjoining the free layer, the magnetic junction further includes an MgO capping layer adjoining the free layer, and the magnetic junction further includes an additional nonmagnetic spacer layer and an additional pinned layer, the free layer being between the nonmagnetic spacer layer and the additional nonmagnetic spacer layer, the additional nonmagnetic spacer layer being between the free layer and the additional pinned layer.

20. The method of claim 19 wherein the free layer consists only of the at least one Fe layer and the at least one magnetic Fe alloy layer.

* * * * *